(12) United States Patent
Jornod et al.

(10) Patent No.: US 7,515,433 B2
(45) Date of Patent: Apr. 7, 2009

(54) METHOD AND APPARATUS FOR PROGRESSIVELY CONNECTING A CONTROLLER TO AN EXTERNAL CIRCUIT OF A BUILDING

(75) Inventors: Eugene R. Jornod, Roscoe, IL (US); Gerald R. Parsons, Caledonia, IL (US)

(73) Assignee: TAC, LLC, Loves Park, IL (US)

( * ) Notice: Subject to any disclaimer, the term of this patent is extended or adjusted under 35 U.S.C. 154(b) by 477 days.

(21) Appl. No.: 11/205,395

(22) Filed: Aug. 17, 2005

(65) Prior Publication Data

US 2006/0039125 A1    Feb. 23, 2006

Related U.S. Application Data

(60) Provisional application No. 60/602,062, filed on Aug. 17, 2004.

(51) Int. Cl.
*H05K 5/00* (2006.01)

(52) U.S. Cl. .......................... 361/756; 361/807; 361/810
(58) Field of Classification Search ................ 361/752, 361/790, 797, 800, 683
See application file for complete search history.

(56) References Cited

U.S. PATENT DOCUMENTS

| 6,137,866 | A * | 10/2000 | Staber et al. ............. 379/93.06 |
| 6,490,165 | B2 * | 12/2002 | Mizusaki ..................... 361/752 |
| 6,618,246 | B2 * | 9/2003 | Sullivan et al. ............. 361/685 |

* cited by examiner

*Primary Examiner*—Hung S Bui
(74) *Attorney, Agent, or Firm*—Reinhart Boerner Van Deuren P.C.

(57) ABSTRACT

A method and apparatus are provided for operatively connecting a controller to an external circuit, by connecting the external circuit to a circuit card mounted for slidable movement into operative engagement with a connection element disposed on a side surface of the controller. The circuit card is slidably supported in a receiver adapted for positioning the controller with respect to the circuit card.

22 Claims, 4 Drawing Sheets

METHOD AND APPARATUS FOR PROGRESSIVELY CONNECTING A CONTROLLER TO AN EXTERNAL CIRCUIT OF A BUILDING

CROSS-REFERENCE TO RELATED PATENT APPLICATIONS

This patent application claims the benefit of U.S. Provisional Patent Application No. 60/602,062, filed Aug. 17, 2004, the teachings and disclosure of which are incorporated herein, in their entireties, by reference.

FIELD OF THE INVENTION

This invention relates to control systems in buildings, and more particularly to connecting a controller to a wiring circuit of a building.

BACKGROUND OF THE INVENTION

Modern buildings typically include a plurality of controllers, located throughout the building, for providing de-centralized control of building subsystems, such as heating, ventilating and air conditioning (HVAC) systems. Such controllers typically are connected, via an electrical circuit external to the controller, to control panels and/or computers located remotely from the controller which supply electrical power and control signals to the controller, which, in turn, redirects the power and control signals to the equipment connected to the controller.

Such controllers typically include active and passive electrical and/or electronic components for performing localized signal conditioning and control functions.

Such controllers are susceptible to being damaged during construction of the building, and/or installation of the control system into a building. It is desirable, therefore, to provide an apparatus and method for progressively installing the controller, during initial rough-in of the building and sequential finishing operations, to limit exposure of the controller, and associated interconnection equipment, to potential damage during construction. It is further desirable, that such an improved method and apparatus provide a compact overall package of the controller, and its related interconnecting elements, which is preferably relatively flat and accessible from one side of a wall upon which the controller is mounted, and in a form which minimizes the projection of the controller and its related interconnecting devices away from the wall.

Prior apparatuses and methods for mounting controllers in buildings through utilization of traditional methods, such as plugging circuit cards into connectors extending axially from a back plane, are not entirely satisfactory in meeting the desires laid out above.

BRIEF SUMMARY OF THE INVENTION

The invention provides an improved apparatus and method for operatively connecting a controller to an external circuit, by connecting the external circuit to a circuit board mounted for slideable movement into operative engagement with a connection element disposed on a side surface of the controller. The circuit card may be slideably supported in a receiver adapted for positioning the controller with respect to the circuit card. By making the connections between the controller and the external circuit with a slideably movable circuit card engaging a connection element disposed on a side surface of the controller, rather than making such a connection with a connector on a rear surface of the controller, as was often done in the past, the invention provides an overall package which is relatively flat, and readily attachable to a mounting surface, such as the wall of an electrical enclosure.

An apparatus and method, according to the invention, allow for sequentially installing the controller through the steps of: attaching a receiver, according to the invention, to a support structure; slideably attaching the circuit card to the receiver; attaching conductor elements of the external circuit to the circuit card; positioning the controller on the receiver; and sliding the circuit card simultaneously with respect to both the controller and the receiver, to thereby provide operative connection with the connection element on the side of the controller.

Through such a sequence, the receiver may be installed very early in the building construction when rough-in operations, such as installation of conduit and pulling wires and/or fiber optic or other power and signal carriers through the conduit, are being accomplished. Once the building has been further completed, to an intermediate state of completion, the circuit card may be attached to the receiver and the wires and/or fiber optic or other power and control carriers connected to the circuit card. When construction of the building has been largely completed, the controller may be installed by positioning it on the receiver, and sliding the circuit card into operative connection with the controller.

Engagement of the circuit card with the controller may serve to at least partially retain the controller on the receiver. The receiver may also be configured for holding the controller in position thereon, prior to engagement of the circuit card with the controller. The receiver may engage and hold the controller in position through gravitational force acting on the controller, or alternatively, the receiver and controller may engage one another through a snap-together connection.

In the form of the invention, an apparatus for operatively connecting a controller, having a connection element through an external circuit, uses a slideably movable circuit card, defining a card plane and having a mating connection element configured for engagement with the connection element of the controller along a connection axis extending substantially parallel to the card plane. The apparatus may include a receiver for slideably supporting the circuit card, positioning the controller with respect to the card plane, and guiding the circuit card in such a manner that the mating connection element of the circuit card moves substantially along the connection axis between an engaged and a disengaged position of the connection element and mating connection element, as the circuit card is slidingly moved with respect to both the receiver and controller while being supported by the receiver. The apparatus may further include the circuit card and/or the controller. The apparatus may further include a cable support adapted for operative attachment thereto of the receiver. The cable support may take the form of a chassis for enclosing the receiver, controller, and circuit card.

In some forms of an apparatus, according to the invention, the controller may also include a second connection element, and the apparatus may further include a second circuit card defining a second card plane and having a second mating connection element configured for engagement with the second connection element of the controller along a second connection axis extending substantially parallel to the second card plane. The receiver may slidingly support the second circuit card, position the controller simultaneously with respect to the first and second card planes, and guide the second circuit card in such a manner that the second mating connection element of the second circuit card moves substantially along the second connection axis between an engaged and a disengaged position of the second connection element and the second mating connection element as the second circuit card is slidingly moved with respect to both the receiver and the controller while being supported by the receiver. The receiver may slidingly support the first and second circuit cards in a common sliding plane, with the first and second circuit cards disposed on opposite sides of the controller, with the first and second connection elements of the controller facing in substantially opposite directions, such that the first and second connections of the controller are engaged by moving the first and second circuit cards toward the controller, and such that the first and second connections of the controller are disengaged by moving the circuit cards away from the controller.

A receiver, according to the invention, may further include one or more tracks for receiving and retaining one or more circuit cards therein. An apparatus, according to the invention, may further include one or more retainers for securing the circuit cards in the tracks.

The invention may take the form of a method for constructing and/or installing and/or repairing or maintaining an apparatus according to the invention.

An apparatus, according to the invention, may also be provided in the form of a kit including one or more of a receiver, circuit card, controller, circuit card retainer, and cable support according to the invention.

Other aspects, objects and advantages of the invention will be apparent from the following detailed description when taken in conjunction with the accompanying drawings.

BRIEF DESCRIPTION OF THE DRAWINGS

The accompanying drawings incorporated in and forming a part of the specification illustrate several aspects of the present invention, and together with the description serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Figure 1:
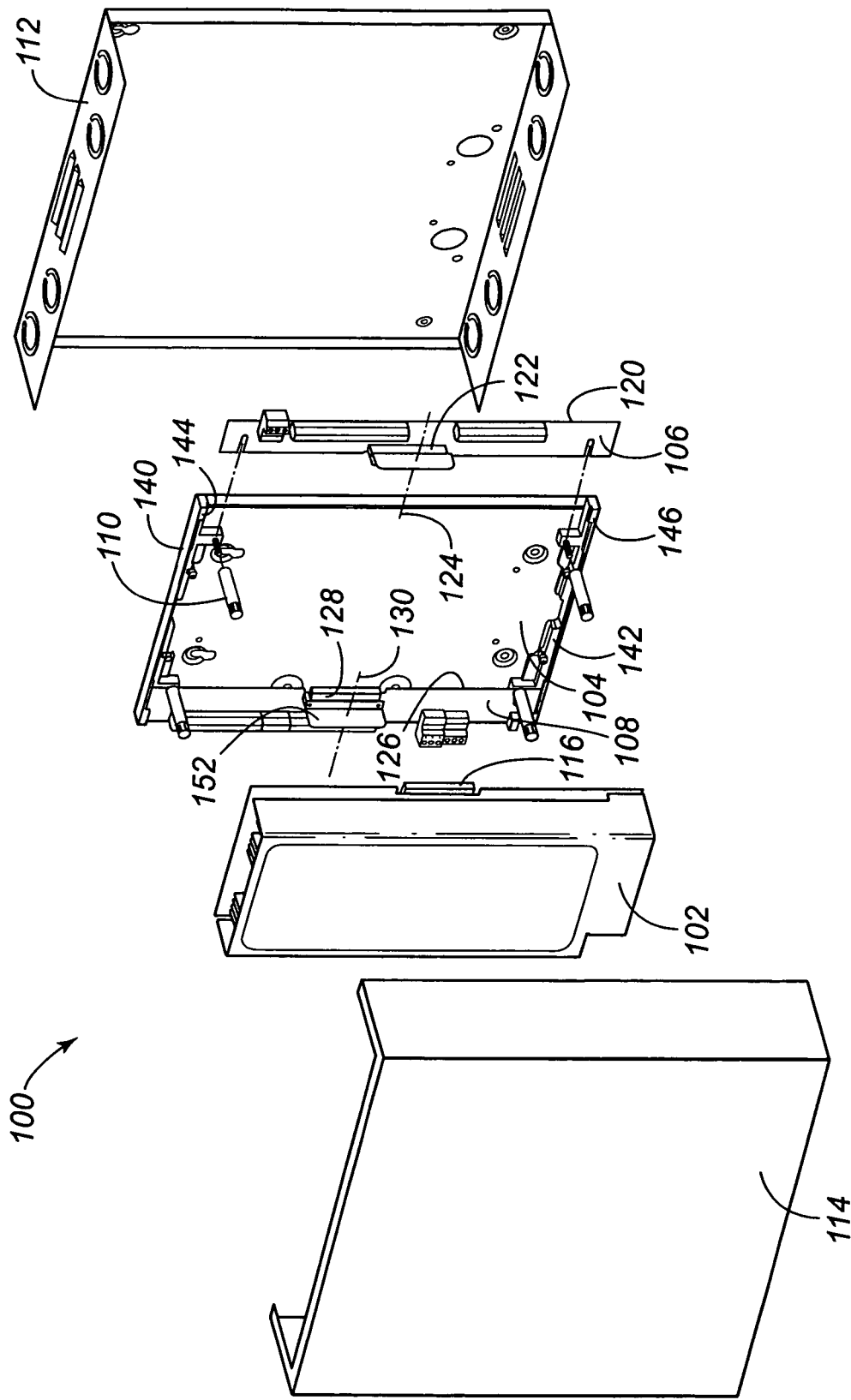
FIG. 1 is an exploded perspective view of a first exemplary embodiment of a controller connection apparatus, according to the invention.
Figure 2:
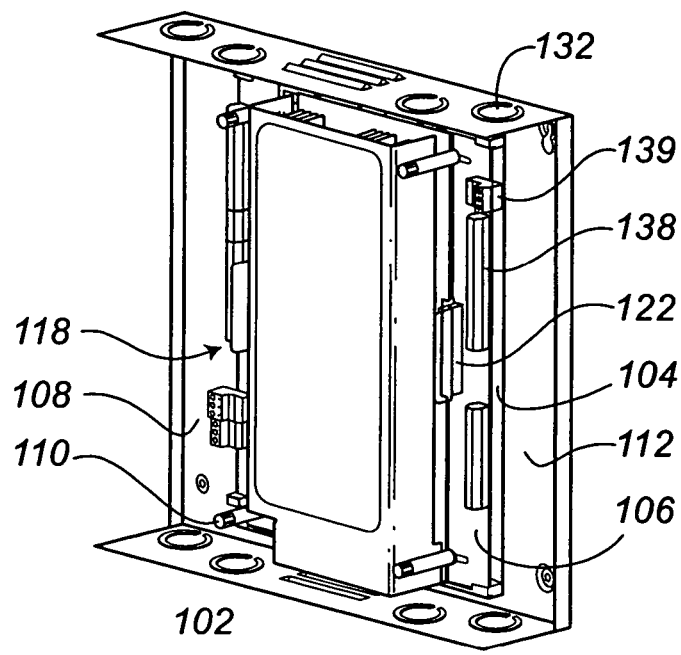
FIG. 2 is a perspective view of the exemplary embodiment of the controller connection apparatus of FIG. 1, with various components thereof shown in an assembled position.

FIG. 1 shows a first exemplary embodiment of a controller connection apparatus 100, according to the invention. The first exemplary embodiment of the controller apparatus 100 includes the controller 102, a receiver 104, first and second control cards 106, 108, four circuit card retainers 110, and a two-part enclosure having a cable-supporting housing 112 and a cover 114.

As shown in FIGS. 1, 2, 6 and 8, the controller 102, of the exemplary embodiment of the controller connection apparatus 100, includes first and second connection elements, in the form of multi-pin electrical connector halves 116, 118, extending in opposite directions, from opposite sides of the controller 102.

The first circuit card 106 includes a printed circuit board which defines a card plane 120 of the first circuit card, and includes a mating connection element, in the form of a multi-pin connector half 122, which is configured for engagement with the first connection element 116 of the controller 102, along a first connection axis 124 which extends substantially parallel to the first card plane 120, when the controller 102 and first circuit card 106 are operatively connected to the receiver 104, in the manner described below in more detail.

In similar fashion, the second circuit card 108 includes a printed circuit board defining a second card plane 126, and also includes a second mating connection element 128, in the form of a multi-pin electrical connector half configured for engagement with the second connection element 118 of the controller 102 along a second connection axis 130, which extends substantially parallel to the second card plane 126, when the second circuit card 108 and controller 102 are operatively installed in the receiver 104, in the manner described in more detail below.

Figure 3:
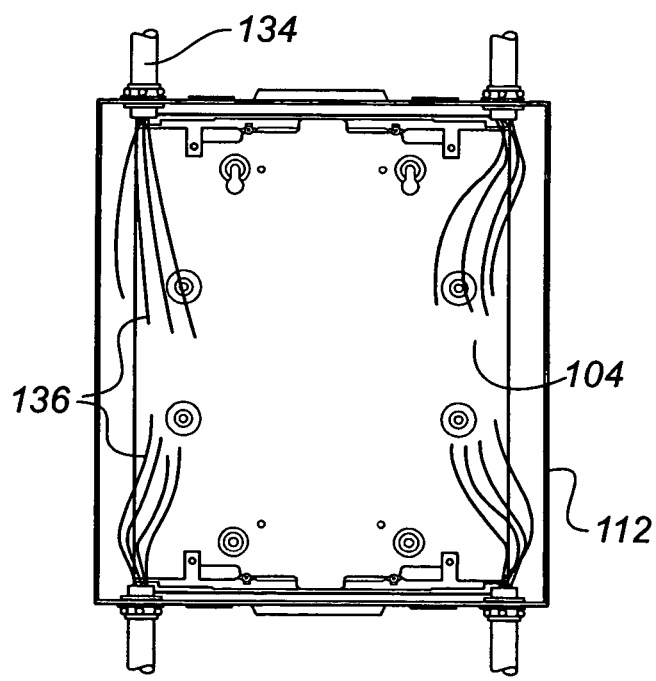
FIGS. 3, 4, 6, and 8 sequentially illustrate the manner in which the first exemplary embodiment of the invention, as shown in FIGS. 1 and 2, may be progressively installed and connected into a control circuit in a building, according to a method of the invention.

As shown in FIG. 3, during rough-in construction of a building, the cable supporting housing 112, of the enclosure, of the exemplary embodiment, is attached to a substantially vertical wall or support structure of the building. The cable support housing 112 includes a plurality of knock-outs 132 (see FIG. 2), which can be removed to allow attachment of conduit runs 134 to the cable support housing 112. Power and signal conductors 136, such as electrical wires and/or fiber optic cables, may then be pulled through the conduit runs 134 into the cable support housing 112, prior to closing in the walls of the building through which the conduit may need to be run. The receiver 104 may also be installed at the same time as the cable support housing 112, using a single set of fasteners (not shown) for attaching both the receiver 104 and the cable support housing 112 to the support structure of the building. Alternatively, the receiver 104 may be installed at a later stage of the construction.

Figure 4:
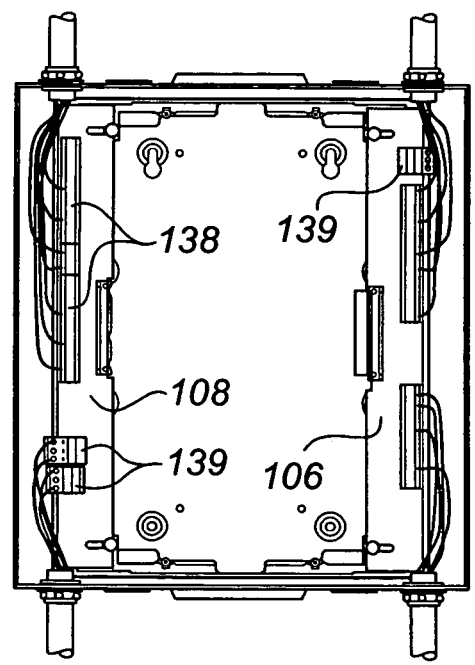

As shown in FIG. 4, after the walls of the building are closed in, or at another appropriate intermediate stage of the construction of the building, the first and second control cards 106, 108 may be installed in the receiver 104, and the power and/or signal conducting elements 136 may be trimmed to length and connected to terminal strips and connectors 138, 139 which are part of the first and second control cards 106, 108.

Figure 5:
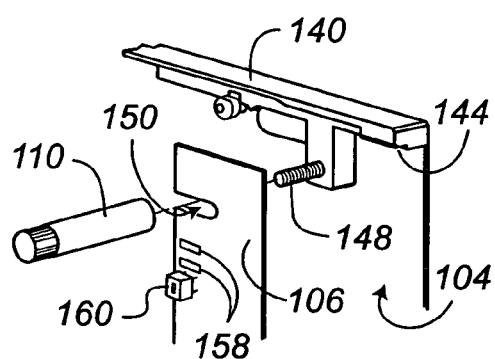
FIG. 5 is an enlarged perspective view of a portion of the first exemplary embodiment of the invention, illustrating the manner in which a circuit card, according to the invention, is connected to a receiver according to the invention.

As illustrated in FIGS. 1 and 5, the receiver 104, of the first exemplary embodiment of a controller connection apparatus 100, according to the invention, includes an upper and a lower track rails 140, 142 each having respective track portions 144, 146 for receiving and retaining within the tracks 144, 146 the upper and lower ends respectively of the first and second circuit cards 106, 108. Threaded studs 148 project outward from the track rails 140, 142, through U-shaped slots 150 in the circuit cards 106, 108, adjacent the upper and lower ends thereof, for threaded engagement with the circuit card retainers 110, which take the form of elongated thumb-screws in the exemplary embodiment.

The tracks 144, 146 and the upper and lower ends of the circuit cards 106, 108 are cooperatively configured in such a manner that, with the circuit card retainers 110 removed, the circuit cards 106, 108 can be inserted at an angle into the tracks 144, 146 and then moved to a non-angled position with respect to the tracks 144, 146, in which the circuit cards 106, 108 are retained within the tracks 144, 146. When the retainers 110 are threaded onto the studs 148, to a position of close proximity to the first and second circuit cards 106, 108, when the circuit cards 106, 108 are positioned within the tracks 144, 146, the retainers 110 prevent the circuit cards 106, 108, from being tilted enough with respect to the tracks 144, 146 to allow removal of the circuit cards 106, 108.

The tracks 144, 146 in the receiver 104 of the first exemplary embodiment of the controller connection apparatus 100, according to the invention, are configured and oriented to slidingly support the first and second circuit cards 106, 108, and guide the circuit cards 106, 108 in such a manner that the second mating connection elements 122, 128 move substantially and respectively along the first and second connection axes 124, 130 between respective engaged positions, when the circuit cards 106, 108 are moved inward toward an innermost extent of their travel within the tracks 144, 146, and respective disengaged positions when the circuit cards 106, 108 are moved outward from the controller to an outermost extent of their respective travels within the tracks 144, 146.

As shown in FIG. 1, a handle 152, in the form of an L-shaped fin, is attached to each of the first and second mating connection elements 122, 128, to facilitate movement of the circuit cards 106, 108 toward and away from the controller 102, for engagement and disengagement of the first and second mating connection elements 122, 128, with the first and second connection elements 116, 118, respectively, of the controller 102.

Figure 7:
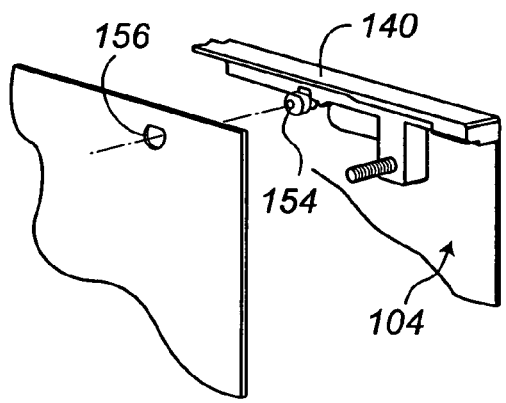
FIG. 7 is an enlarged perspective view of a portion of the first exemplary embodiment of the invention, illustrating the manner in which a controller, of the first exemplary embodiment, is positioned and supported by a receiver of the first exemplary embodiment.

As shown in FIG. 7, the upper track rail 140 also includes a pair of hooks 154 for engaging corresponding D-shaped openings 156 in the rear surface of the controller 102, in such a manner that the receiver 104 positions the controller simultaneously with respect to the first and second card planes 120, 126 and the first and second connection axes 124, 130. The hooks 154, of the first exemplary embodiment of the invention, are configured for engaging and holding the controller 102 in position on the receiver 104, when the connection elements 116, 118 and mating connection elements 122, 128 are not engaged, through gravitational force acting on the controller 102.

Figure 6:
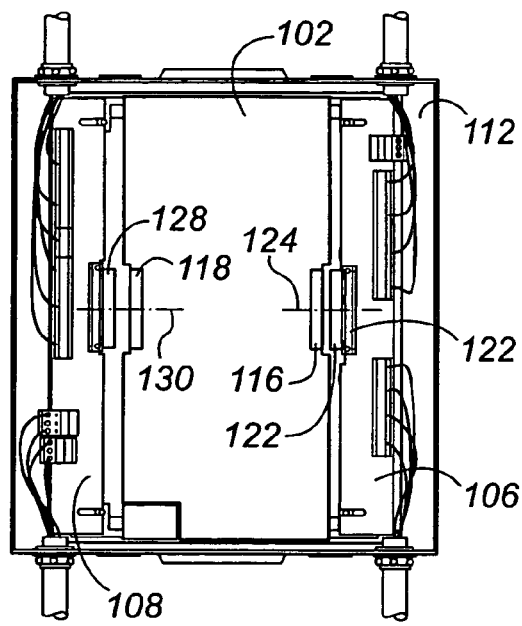
Figure 8:
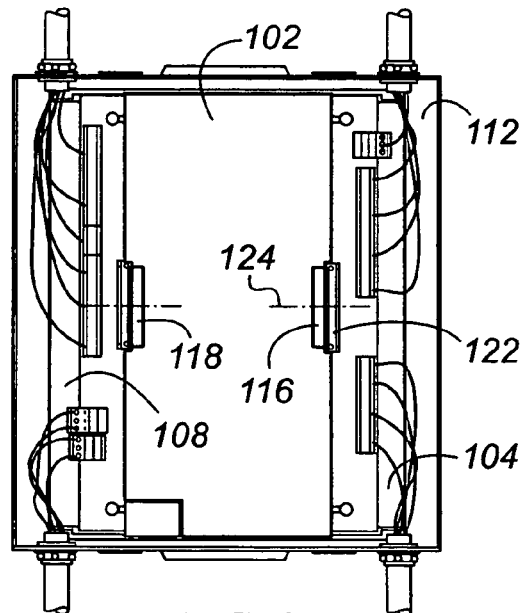

As shown in FIG. 6, when construction on the building has progressed to a point where it is desirable and safe to do so, the first and second circuit cards 106, 108 are moved outward toward the outermost extent of their travel in the tracks 144, 146, and the controller 102 is placed in position between the circuit cards 106, 108 on the receiver 104. The first and second circuit cards 106, 108 are then moved inward, as shown in FIG. 8, toward the controller 102, to thereby engage the first and second mating connector elements 122, 128 on the first and second control cards 106, 108 with the first and second connection elements 116, 118, respectively, on the controller 102, to thereby complete installation and connection of the controller 102 into the external circuit of the building.

Figure 9:
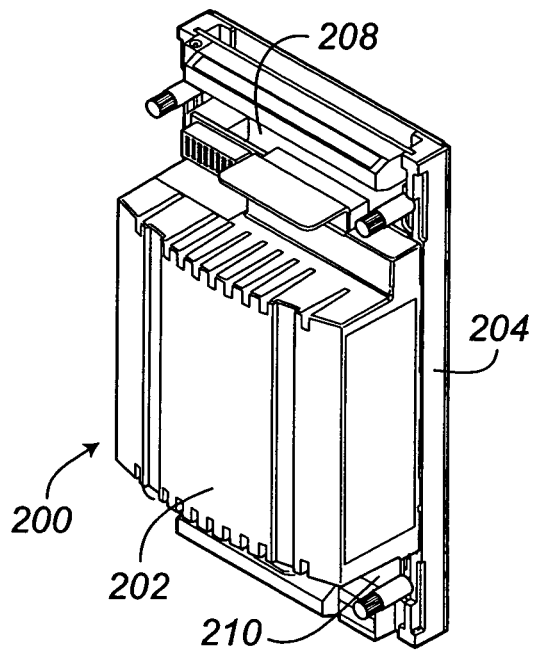
FIG. 9 is a perspective illustration of a second exemplary embodiment of a control connection apparatus, according to the invention.
Figure 10:
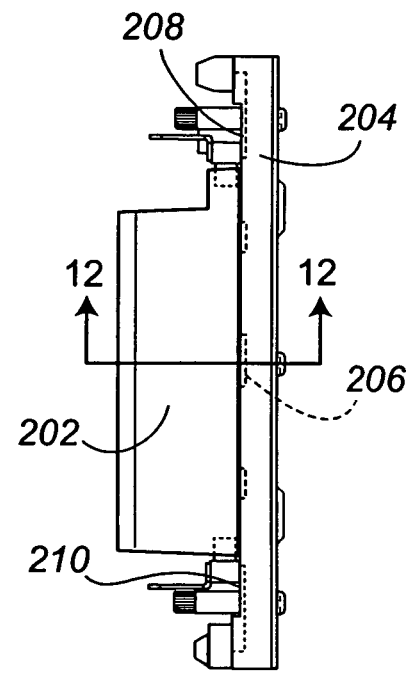
FIG. 10 is a schematic cross-sectional illustration of a snap-together connection between a controller and a receiver of the second exemplary embodiment of the invention.

FIGS. 9 and 10 show a second exemplary embodiment of a controller connection apparatus 200, according to the invention. The second exemplary embodiment of the controller connection apparatus 200 embodies the same aspects and elements of the invention described above with regard to the first exemplary embodiment 100 of the invention, except that the controller 202 and receiver 204 of the second embodiment engage one another through a snap-together connection, as illustrated at 206, rather than using the hooks 154 and D-shaped openings 156 of the first exemplary embodiment of the controller connection apparatus 100, described above. The snap-together connection 206 provides an alternate means of securing the controller 202 in position on the receiver 204, prior to engagement of the controller 202 by circuit boards 208, 210, without reliance upon gravitational force acting on the controller 202. As a result of this configuration, the second embodiment of the invention 200 may be preferable where the support structure to which the receiver 204 is attached is not substantially vertical.

Figure 11:
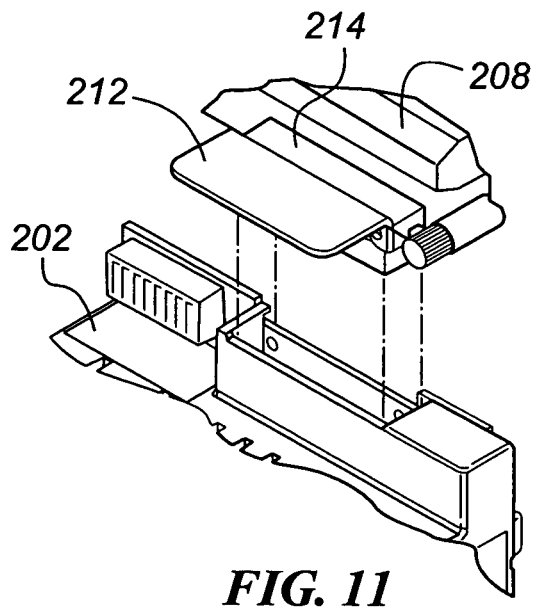
FIG. 11 is an enlarged perspective view illustrating handles, according to the invention, for facilitating engagement and disengagement of connection elements, according to the invention.
Figure 12:
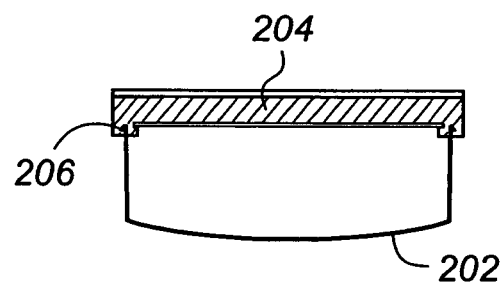
FIG. 12 is a cross-sectional view taken along line 12-12 in FIG. 10.

As shown in FIG. 11, the circuit cards 208, 210 of the second exemplary embodiment of the invention 200 also include handles 212, in the form of an L-shaped fin, attached to the mating connection elements 214 to facilitate movement of the circuit cards 208, 210 toward and away from the controller 202, for electrically connecting the circuit cards 208, 210 with the controller 202.

Although the invention has been described herein with reference to the first and second exemplary embodiments thereof, it will be understood, by those having skill in the art, that the invention may be practiced in many other forms. For example, in some embodiments of the invention, a receiver, one or more circuit cards, and a controller, according to the invention, may be attached directly to a support structure, or installed inside of an electrical cabinet, for example, without utilizing an enclosure 112, 114 according to the invention.

As illustrated in FIG. 5, it is further contemplated, that in practicing the invention, circuit cards, according to the invention, may include electrical and/or electronic circuit components 158, 160, in addition to external circuit connectors, such as the terminal strips 138 and connectors 139 utilized in the exemplary embodiments described herein. For clarity of illustration in the drawings, the electronic and/or electronic circuit components 158, 160 are only shown in the enlarged view of FIG. 5. It is understood, however, that in many embodiments of the invention, including the two exemplary embodiments 100, 200 described herein, the slidable circuit cards 106, 108, 208, 210, for example, may include electrical and/or electronic circuit components in the manner illustrated in FIG. 5 specifically with regard to the circuit card 106 of the first exemplary embodiment 100 described herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An apparatus comprising:
   a controller including a connection element;
   a circuit card defining a card plane and having a mating connection element configured for engagement with the connection element of the controller along a connection axis extending substantially parallel to the card plane; and
   a receiver, slidingly supporting the circuit card, positioning the controller with respect to the card plane, and guiding the circuit card in such a manner that the mating connection element of the circuit card moves substantially along the connection axis between an engaged and a disengaged position of the connection element and mating connection element as the circuit card is slidingly moved with respect to both the receiver and controller while being supported by the receiver.

2. The apparatus of claim 1, further comprising a cable support adapted for attachment thereto of the receiver.

3. The apparatus of claim 1, wherein the circuit card includes a handle for facilitating application of force to the circuit board in a direction substantially along the connection axis.

4. The apparatus of claim 1, wherein the circuit board includes external circuit connectors and electrical and/or electronic circuit components.

5. The apparatus of claim 1, wherein the controller extends through an extension of the card plane when being supported by the receiver.

6. The apparatus of claim 1, wherein the receiver engages and holds the controller in position when the connection element and mating connection element are not engaged.

7. The apparatus of claim 6, wherein the receiver engages and holds the controller in position through gravitational force acting on the controller.

8. The apparatus of claim 6, wherein the receiver and controller engage one another through a snap-together connection.

9. The apparatus of claim 1, wherein engagement of the connection element and the mating connection element secures the controller to the receiver.

10. The apparatus of claim 1, wherein:
    the controller includes a second connection element;
    the apparatus further comprises a second circuit card defining a second card plane and having a second mating connection element configured for engagement with the second connection element of the controller along a second connection axis extending substantially parallel to the second card plane; and
    the receiver, slidingly supports the second circuit card, positions the controller simultaneously with respect to the first and second card planes, and guides the second circuit card in such a manner that the second mating connection element of the second circuit card moves substantially along the second connection axis between an engaged and a disengaged position of the second connection element and the second mating connection element as the second circuit card is slidingly moved with respect to both the receiver and controller while being supported by the receiver.

11. The apparatus of claim 10, wherein the receiver slidingly supports the first and second circuit cards in a common sliding plane, with the first and second circuit cards disposed on opposite sides of the controller, the first and second connection elements of the controller face in substantially opposite directions, the first and second connections of the controller are engaged by moving the circuit cards toward the controller, and the first and second connections of the controller are disengaged by moving the circuit cards away from the controller.

12. The apparatus of claim 11, wherein the receiver further includes one or more tracks for receiving and retaining the first and second circuit cards therein.

13. The apparatus of claim 12, further including one or more retainers for securing the first and second circuit cards in the one or more tracks.

14. The apparatus of claim 1, wherein the receiver further includes a track for receiving and retaining the circuit card therein.

15. The apparatus of claim 14, further including one or more retainers for securing the circuit card in the track.

16. An apparatus for operatively connecting a controller having a connection element to an external circuit, using a slidably movable circuit card defining a card plane and having a mating connection element configured for engagement with the connection element of the controller along a connection axis extending substantially parallel to the card plane, the apparatus comprising:
    a receiver for slidingly supporting the circuit card, positioning the controller with respect to the card plane, and guiding the circuit card in such a manner that the mating connection element of the circuit card moves substantially along the connection axis between an engaged and a disengaged position of the connection element and mating connection element as the circuit card is slidingly moved with respect to both the receiver and controller while being supported by the receiver.

17. The apparatus of claim 16, further comprising the circuit card.

18. The apparatus of claim 16, further comprising the controller.

19. The apparatus of claim 16, further comprising a cable support adapted for operative attachment thereto of the receiver.

20. The apparatus of claim 19, wherein the cable support comprises a chassis for enclosing the receiver, controller, and circuit card.

21. A method for operatively connecting a controller to an external circuit, the method comprising:
connecting the external circuit to a circuit card mounted for slidable movement into operative engagement with a connection element disposed on a side surface of the controller;
slidably supporting the circuit card in a receiver adapted for positioning the controller with respect to the circuit card;
sequentially performing the stops of:
attaching the receiver to a support;
slidably attaching the circuit card to the receiver;
attaching circuit elements of the external circuit to the circuit card;
positioning the controller on the receiver; and
sliding the circuit card, simultaneously with respect to both the controller and the receiver, into operative connection with the connection element on the side of the controller;
wherein the controller further includes a second control element extending from an opposite side of the controller, and the method further comprises, connecting the external circuit to a second circuit board mounted for slidable movement into operative engagement with the second connection element of the controller.

22. The method of claim 21, further comprising at least partially securing the controller to the receiver with the operative connection between the circuit card and the connection element of the controller.

* * * * *